(12) United States Patent
Ishikawa

(10) Patent No.: US 11,488,924 B2
(45) Date of Patent: Nov. 1, 2022

(54) SEMICONDUCTOR ELEMENT BONDING SUBSTRATE, SEMICONDUCTOR DEVICE, AND POWER CONVERSION DEVICE

(71) Applicant: Mitsubishi Electric Corporation, Tokyo (JP)

(72) Inventor: Satoru Ishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/494,286

(22) PCT Filed: Jun. 2, 2017

(86) PCT No.: PCT/JP2017/020607
§ 371 (c)(1),
(2) Date: Sep. 14, 2019

(87) PCT Pub. No.: WO2018/220819
PCT Pub. Date: Dec. 6, 2018

(65) Prior Publication Data
US 2020/0135682 A1    Apr. 30, 2020

(51) Int. Cl.
*H01L 23/00*    (2006.01)
*H01L 23/13*    (2006.01)
*H01L 21/52*    (2006.01)

(52) U.S. Cl.
CPC .............. *H01L 24/32* (2013.01); *H01L 21/52* (2013.01); *H01L 23/13* (2013.01);
(Continued)

(58) Field of Classification Search
None
See application file for complete search history.

(56) References Cited

U.S. PATENT DOCUMENTS

2005/0221538 A1    10/2005  Suzuki et al.
2012/0306087 A1*   12/2012  Bayerer .............. H01L 24/05
                                                    257/772
(Continued)

FOREIGN PATENT DOCUMENTS

JP    H04-087393 A    3/1992
JP    2004-119568 A   4/2004
(Continued)

OTHER PUBLICATIONS

International Search Report issued in PCT/JP2017/020607; dated Aug. 22, 2017.
(Continued)

*Primary Examiner* — Jay C Chang
(74) *Attorney, Agent, or Firm* — Studebaker & Brackett PC

(57) ABSTRACT

A semiconductor element bonding substrate according to the present invention includes an insulating plate, and a metal pattern bonded to a main surface of the insulating plate. A main surface of the metal pattern on an opposite side of the insulating plate includes a bonding region to which a semiconductor element is bonded by a solder. The metal pattern includes at least one concave part located in the main surface. The at least one concave part is located closer to an edge of the bonding region in relation to a center part of the bonding region in the bonding region.

5 Claims, 8 Drawing Sheets

(52) U.S. Cl.
CPC .............. *H01L 2224/32225* (2013.01); *H01L 2224/83385* (2013.01); *H01L 2924/13055* (2013.01)

(56) References Cited

U.S. PATENT DOCUMENTS

| | | | | |
|---|---|---|---|---|
| 2015/0257252 A1* | 9/2015 | Kato | ........................ | H01L 24/83 257/773 |
| 2016/0165749 A1* | 6/2016 | Hong | ................ | H01L 23/49568 361/715 |
| 2018/0366346 A1* | 12/2018 | Mori | ................... | H01L 29/8083 |
| 2019/0157221 A1* | 5/2019 | Soyano | ................... | H01L 25/18 |

FOREIGN PATENT DOCUMENTS

| | | | |
|---|---|---|---|
| JP | 2005-260181 A | 9/2005 | |
| JP | 2007-110001 A | 4/2007 | |
| JP | 2009-094135 A | 4/2009 | |

OTHER PUBLICATIONS

Office Action; "Notification of Reasons for Refusal," mailed by the Japanese Patent Office dated May 12, 2020, which corresponds to Japanese Patent Application No. 2019-521897 and is related to U.S. Appl. No. 16/494,286; with English language translation.

* cited by examiner

F I G . 3
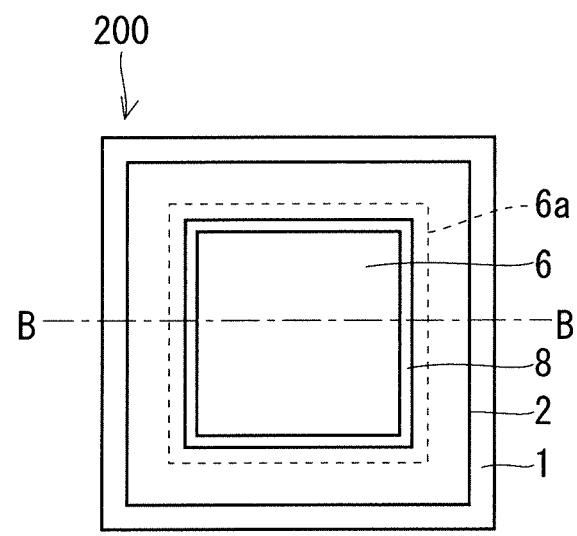
F I G . 4
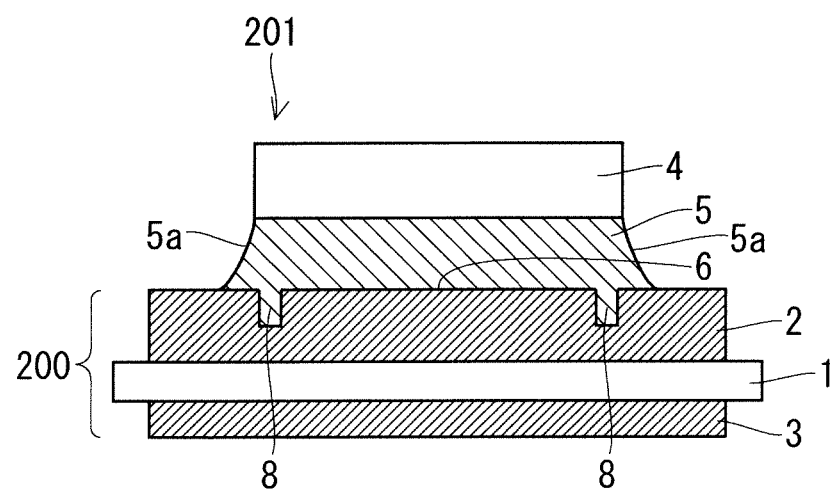

F I G. 1 5
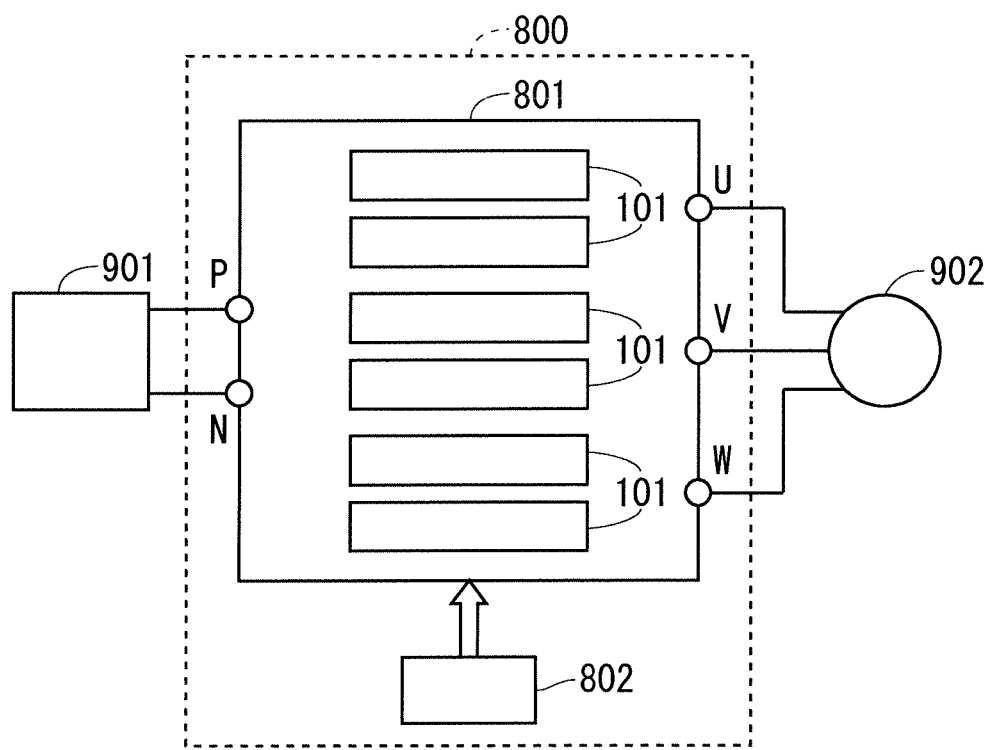

SEMICONDUCTOR ELEMENT BONDING SUBSTRATE, SEMICONDUCTOR DEVICE, AND POWER CONVERSION DEVICE

TECHNICAL FIELD

The present invention relates to a semiconductor element bonding substrate, a semiconductor device, and a power conversion device.

BACKGROUND ART

As a solder for bonding a semiconductor element and an insulating substrate, a non-eutectic solder, which is mainly made of an Sn—Cu based, Sn—Ag based, Sn—Sb based, Sn—In based, or Sn—Bi based component, is used to secure high reliability. These types of solders have a problem that a solder shrinkage cavity easily occurs.

Recently, a semiconductor element operating under high temperature is intensively developed, and a downsizing, high tolerance, and high current density growth of the semiconductor element are promoted. Particularly, a wide-band gap semiconductor such as SiC and GaN has a larger bandgap than an Si semiconductor, thus a high tolerance, downsizing, high current density growth, and operation under high temperature of a semiconductor device are expected (refer to Patent Document 1, for example). However, when a solder shrinkage cavity occurs immediately below the semiconductor element, a heat radiation property at a time of an occurrence of heat in the semiconductor element is reduced, and it leads to a reduction in characteristics. Accordingly, it is necessary to suppress the occurrence of the solder shrinkage cavity and secure a stable operation of the semiconductor device.

PRIOR ART DOCUMENTS

Patent Documents

Patent Document 1: Japanese Patent Application Laid-Open No. 2005-260181

SUMMARY

Problem to be Solved by the Invention

A planar metal pattern for solder-bonding the semiconductor element is formed on a surface of an insulating substrate of a conventional semiconductor device. A shrinkage cavity tends to occur in a clotted solder at the time of solder-bonding the semiconductor element to the metal pattern. When the solder shrinkage cavity occurs immediately below an end portion of the semiconductor element, the heat radiation property of the semiconductor element decreases, so that the solder shrinkage cavity causes a reduction in electrical characteristics and thermal resistance in the semiconductor element. Thus, it is necessary to melt again the solder to correct the shrinkage cavity or discard the semiconductor element, so that the shrinkage cavity causes a reduction in productivity.

The present invention therefore has been made to solve problems as described above, and it is an object of the present invention to provide a semiconductor element bonding substrate, a semiconductor device, and a power conversion device suppressing an occurrence of a shrinkage cavity at a time of bonding a semiconductor element to a substrate by a solder and improving a heat radiation property of the semiconductor element.

Means to Solve the Problem

A semiconductor element bonding substrate according to the present invention includes an insulating plate, and a metal pattern bonded to a main surface of the insulating plate. A main surface of the metal pattern on an opposite side of the insulating plate includes a bonding region to which a semiconductor element is bonded by a solder. The metal pattern includes at least one concave part located in the main surface. The at least one concave part is located closer to an edge of the bonding region in relation to a center part of the bonding region in the bonding region.

A semiconductor element bonding substrate according to the present invention includes: an insulating plate; and a metal pattern bonded to a main surface of the insulating plate. A main surface of the metal pattern on an opposite side of the insulating plate includes a bonding region to which a semiconductor element is bonded by a solder, and in the bonding region, the main surface of the metal pattern has a height different between a center part of the bonding region and a surrounding area of the center part.

Effects of the Invention

In the semiconductor element bonding substrate according to the present invention, the concave part is provided near the edge of the bonding region in the main surface of the metal pattern. The solder is supplied to an inner side of the concave part when the semiconductor element is solder-bonded to the bonding region. When the melted solder is clotted, the solder filling the inner side of the concave part shrinks, thereby reducing a shrinkage of a fillet part of the solder. Thus, it can be suppressed that a shrinkage cavity occurs in the fillet part of the solder and the shrinkage cavity enters a lower side of the semiconductor element. The occurrence of the shrinkage cavity in the solder is suppressed, thus the heat radiation property can be improved in the semiconductor device.

According to the semiconductor element bonding substrate in the present embodiment, the height of the main surface of the metal pattern is made different between the center part of the bonding region and the surrounding area of the center part, thus a timing of clotting the solder can be made different between the center part of the bonding region and the surrounding area of the center part. For example, the height of the center part of the bonding region is lowered than the surrounding area of the center part, thus the solder is supplied to the depressed part in a center of the bonding region, and the solder filling the depressed part increases a heat capacity in a portion immediately below the center part of the semiconductor element. Accordingly, the solder located near the edge of the bonding region can be clotted first. That is to say, the center part of the bonding region is a part where the solder is clotted last, thus an occurrence of a shrinkage cavity can be suppressed in a fillet part where the solder is clotted early. The center part of the bonding region has the height higher than the surrounding area of the center part, a larger amount of solder is supplied to the surrounding area of the center part of the bonding region compared to the center part. Thus, when the melted solder is clotted, the solder in the surrounding area of the center part of the bonding region shrinks, thereby reducing a shrinkage of a fillet part of the solder. Thus, an occurrence of a shrinkage cavity can be suppressed in a fillet part of the solder. The occurrence of the shrinkage cavity in the solder is suppressed, thus the heat radiation property can be improved in the semiconductor device.

These and other objects, features, aspects and advantages of the present invention will become more apparent from the following detailed description of the present invention when taken in conjunction with the accompanying drawings.

BRIEF DESCRIPTION OF DRAWINGS

FIG. 3 A plan view of a semiconductor element bonding substrate according to an embodiment 2.

FIG. 4 A cross-sectional view of a semiconductor device according to the embodiment 2.

FIG. 15 A diagram illustrating a configuration of a power conversion device according to an embodiment 8.

DESCRIPTION OF EMBODIMENT(S)

Embodiment 1

Figure 1:
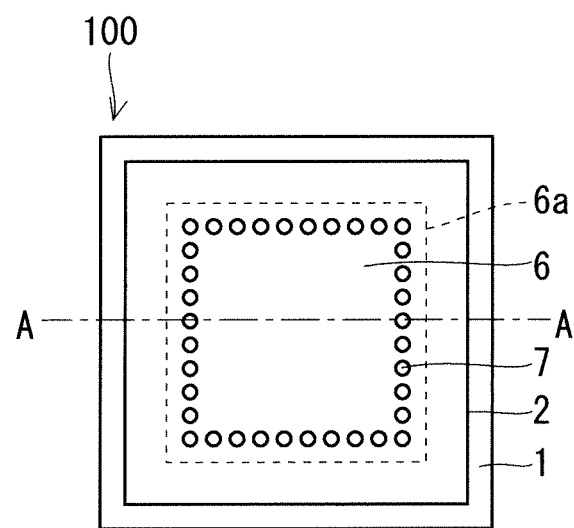
FIG. 1 A plan view of a semiconductor element bonding substrate according to an embodiment 1.
Figure 2:
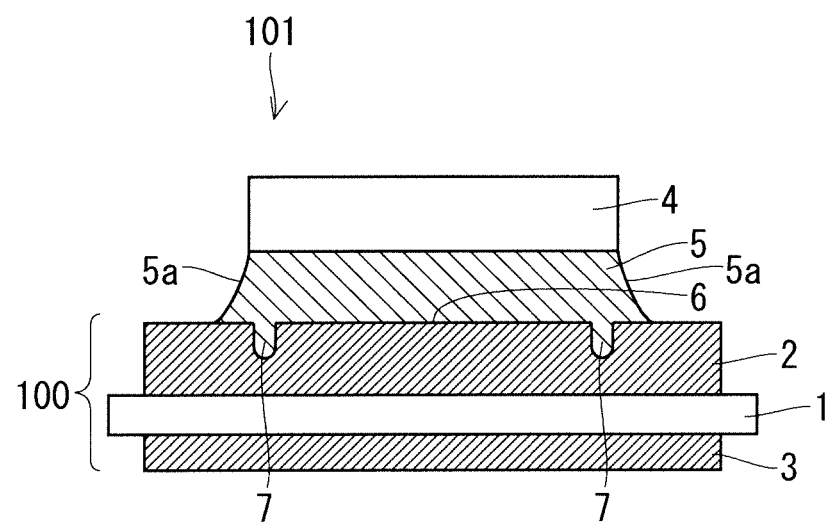
FIG. 2 A cross-sectional view of a semiconductor device according to the embodiment 1.

FIG. 1 is a plan view of a semiconductor element bonding substrate 100 according to a present embodiment 1. FIG. 2 is a cross-sectional view of a semiconductor device 101 according to the present embodiment 1. In the semiconductor device 101 illustrated in FIG. 2, a semiconductor element 4 is bonded to a bonding region 6a in the semiconductor element bonding substrate 100 by a solder 5. A cross section of the semiconductor device 101 illustrated in FIG. 2 corresponds to a cross section along a line segment A-A in FIG. 1.

The semiconductor element bonding substrate 100 includes an insulating plate 1 and a metal pattern 2. The metal pattern 2 is bonded to a main surface of the insulating plate 1. A main surface 6 of the metal pattern 2 on an opposite side of the insulating plate 1 includes the bonding region 6a to which the semiconductor element 4 is bonded by the solder 5. A plurality of concave parts 7 are formed in the bonding region 6a in the main surface 6 of the metal pattern 2. In the bonding region 6a, the plurality of concave parts 7 are located closer to an edge of the bonding region 6a in relation to a center part of the bonding region 6a. As illustrated in FIG. 2, the concave part 7 is formed in a position in the metal pattern 2 located immediately below an end portion of the semiconductor element 4.

The plurality of concave parts 7, are formed in FIG. 1, and when at least one concave part 7 is formed, an effect of reducing an occurrence of a shrinkage cavity described below can be obtained.

Plating may be performed on the main surface 6 of the metal pattern 2 to bond the metal pattern 2 and the semiconductor element 1 more successfully. As illustrated in FIG. 2, a back surface metal pattern 3 may be bonded to a surface of the insulating plate 1 on an opposite side of the metal pattern 2.

The semiconductor element 4 is a power semiconductor element including an SiC semiconductor, for example. The semiconductor element 4 is an insulated gate bipolar transistor (IGBT) or a metal-oxide-semiconductor field-effect transistor (MOSFET), for example.

<Effect>

The semiconductor element bonding substrate 100 in the present embodiment 1 includes the insulating plate 1 and the metal pattern 2 bonded to the main surface of the insulating plate 1. The main surface 6 of the metal pattern 2 on the opposite side of the insulating plate 1 includes the bonding region 6a to which the semiconductor element 4 is bonded by the solder 5. The metal pattern 2 includes at least one concave part 7 located in the main surface 6. At least one concave part 7 is located closer to the edge of the bonding region 6a in relation to the center part of the bonding region 6a in the bonding region 6a.

In the semiconductor element bonding substrate 100 according to the present embodiment 1, the concave part 7 is provided near the edge of the bonding region 6a in the main surface 6 of the metal pattern 2. The solder is supplied to an inner side of the concave part 7 when the semiconductor element 4 is solder-bonded to the bonding region 6a. When the melted solder 5 is clotted, the solder 5 filling the inner side of the concave part 7 shrinks, thereby reducing a shrinkage of a fillet part 5a of the solder 5. Thus, it can be suppressed that a shrinkage cavity occurs in the fillet part 5a of the solder 5 and the shrinkage cavity enters a lower side of the semiconductor element 4. The occurrence of the shrinkage cavity in the solder 5 is suppressed, thus the heat radiation property can be improved in the semiconductor device 101.

In the semiconductor element bonding substrate 100 according to the present embodiment 1, at least one concave part includes the plurality of concave parts 7, and the plurality of concave parts 7 are located along the edge of the bonding region 6a. Accordingly, the plurality of concave parts 7 are located along the edge of the bonding region 6a, the occurrence of the shrinkage cavity can be suppressed over an outer periphery of the solder 5 bonding the semiconductor element 4.

Embodiment 2

FIG. 3 is a plan view of a semiconductor element bonding substrate 200 according to a present embodiment 2. FIG. 4 is a cross-sectional view of a semiconductor device 201 according to the present embodiment 2. In the semiconductor device 201 illustrated in FIG. 4, a semiconductor element 4 is bonded to a bonding region 6a in the semiconductor element bonding substrate 200 by a solder 5. A cross section of the semiconductor device 201 illustrated in FIG. 4 corresponds to a cross section along a line segment B-B in FIG. 3.

The semiconductor element bonding substrate 200 includes an insulating plate 1 and a metal pattern 2. The metal pattern 2 is bonded to a main surface of the insulating plate 1. A main surface 6 of the metal pattern 2 on an opposite side of the insulating plate 1 includes the bonding region 6a to which the semiconductor element 4 is bonded by the solder 5. A continuous groove 8 is formed in the bonding region 6a in the main surface of the metal pattern 2. The continuous groove 8 is located along an edge of the bonding region 6a in the bonding region 6a. As illustrated in FIG. 4, the continuous groove 8 is formed in a position in the metal pattern 2 located immediately below an end portion of the semiconductor element 4.

Plating may be performed on the main surface 6 of the metal pattern 2 to bond the metal pattern 2 and the semiconductor element 1 more successfully. As illustrated in FIG. 4, a back surface metal pattern 3 may be bonded to a surface of the insulating plate 1 on an opposite side of the metal pattern 2.

<Effect>

In the semiconductor element bonding substrate 200 according to the present embodiment 2, the concave part 7 described in the embodiment 1 is the continuous groove 8 located along the edge of the bonding region 6a. Accordingly, the continuous groove 8 is located along the edge of the bonding region 6a, thus a larger amount of solder 5 is supplied to an inner side of the groove 8 compared to the case of providing the concave part 7 as described in the embodiment 1. Thus, it can be suppressed more effectively that a shrinkage cavity occurs in the fillet part 5a of the solder 5 and the shrinkage cavity enters a lower side of the semiconductor element 4.

Embodiment 3

Figure 5:
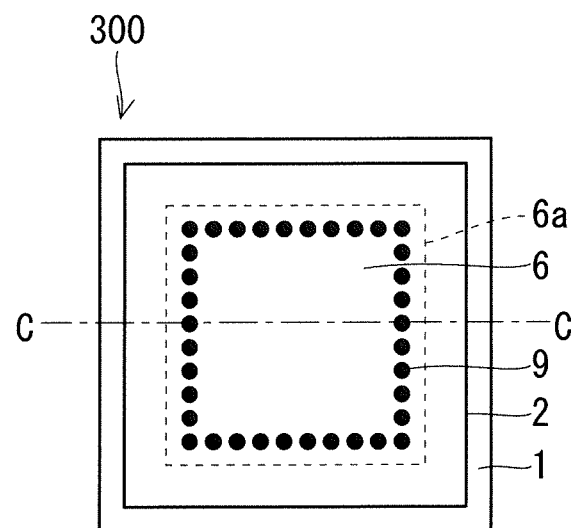
FIG. 5 A plan view of a semiconductor element bonding substrate according to an embodiment 3.
Figure 6:
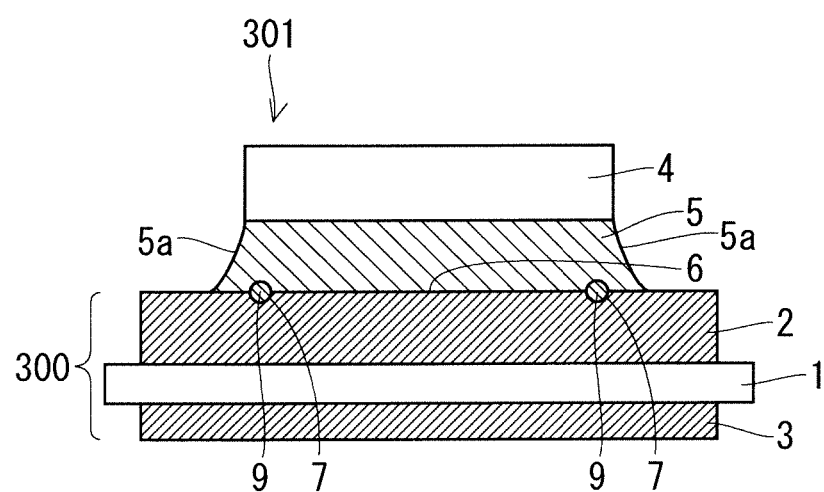
FIG. 6 A cross-sectional view of a semiconductor device according to the embodiment 3.

FIG. 5 is a plan view of a semiconductor element bonding substrate 300 according to a present embodiment 3. FIG. 6 is a cross-sectional view of a semiconductor device 301 according to the present embodiment 3. In the semiconductor device 301 illustrated in FIG. 6, a semiconductor element 4 is bonded to a bonding region 6a in the semiconductor element bonding substrate 300 by a solder 5. A cross section of the semiconductor device 301 illustrated in FIG. 6 corresponds to a cross section along a line segment C-C in FIG. 5.

The semiconductor element bonding substrate 300 further includes a metal member 9 located in each of the plurality of concave parts 7 when compared with the semiconductor element bonding substrate 100 (FIG. 1) in the embodiment 1. The metal member 9 is formed of a material having a larger heat conductivity than the solder 5. The metal member 9 has a spherical shape. The metal member 9 is made of Cu, Ni, Au, Ag, Cu plated with Ni, or Al plated with Ni, for example. The semiconductor element bonding substrate 300 has the same configuration as the semiconductor element bonding substrate 100 (FIG. 1) other than the metal member 9, thus the description is omitted.

<Effect>

The semiconductor element bonding substrate 300 according to the present embodiment 3 further includes the metal member 9 located in each of the plurality of concave parts 7 in the semiconductor element bonding substrate 100 in the embodiment 1, and the heat conductivity of the metal member 9 is larger than that of the solder 5.

In the semiconductor element bonding substrate 300 according to the present embodiment 3, the concave part 7 is provided near the edge of the bonding region 6a in the main surface 6 of the metal pattern 2, and the metal member 9 is located in the concave part 7. When the semiconductor element 4 is solder-bonded to the bonding region 6a and the melted solder 5 is clotted, the solder 5 located near the edge of the bonding region 6a where the metal member 9 having the large heat conductivity is located can be clotted first. That is to say, a center part of the bonding region 6a is a part where the solder 5 is clotted last, thus an occurrence of a shrinkage cavity can be suppressed in a fillet part 5a where the solder 5 is clotted early. The occurrence of the shrinkage cavity in the solder 5 is suppressed, thus the heat radiation property can be improved in the semiconductor device 301.

Embodiment 4

Figure 7:
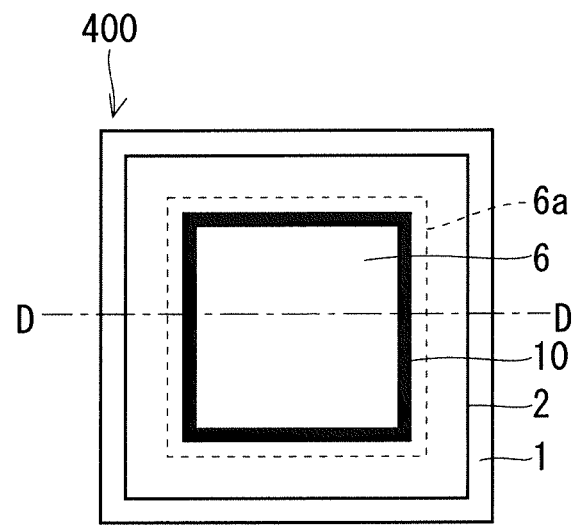
FIG. 7 A plan view of a semiconductor element bonding substrate according to an embodiment 4.
Figure 8:
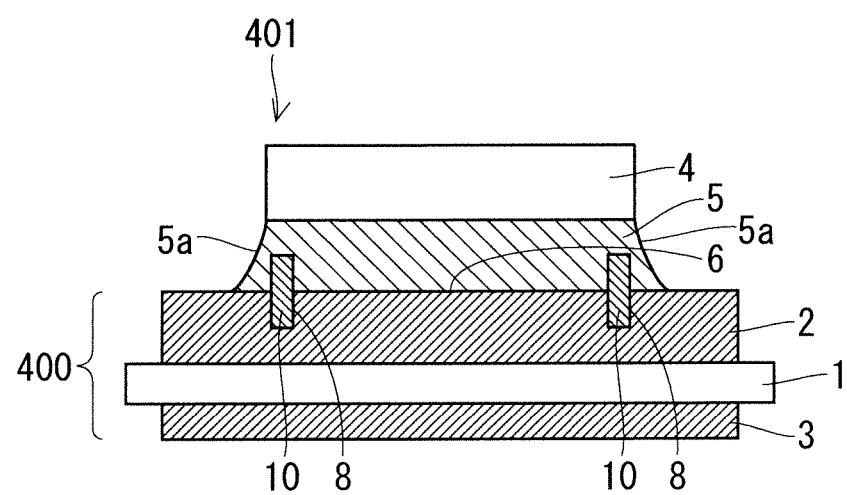
FIG. 8 A cross-sectional view of a semiconductor device according to the embodiment 4.

FIG. 7 is a plan view of a semiconductor element bonding substrate 400 according to a present embodiment 4. FIG. 8 is a cross-sectional view of a semiconductor device 401 according to the present embodiment 4. In the semiconductor device 401 illustrated in FIG. 8, a semiconductor element 4 is bonded to a bonding region 6a in the semiconductor element bonding substrate 400 by a solder 5. A cross section of the semiconductor device 301 illustrated in FIG. 8 corresponds to a cross section along a line segment D-D in FIG. 7.

The semiconductor element bonding substrate 400 further includes a metal member 10 located in a groove 8 when compared with the semiconductor element bonding substrate 200 (FIG. 3) in the embodiment 2. The metal member 10 is formed of a material having a larger heat conductivity than the solder 5. The metal member 10 has a frame-like shape. The metal member 10 is made of Cu, Ni, Au, Ag, Cu plated with Ni, or Al plated with Ni, for example. The semiconductor element bonding substrate 400 has the same configuration as the semiconductor element bonding substrate 200 (FIG. 3) other than the metal member 10, thus the description is omitted.

<Effect>

The semiconductor element bonding substrate 400 according to the present embodiment 4 further includes the metal member 10 located in the groove 8 in the semiconductor element bonding substrate 200 in the embodiment 2, and the heat conductivity of the metal member 10 is larger than that of the solder 5.

In the semiconductor element bonding substrate 400 according to the present embodiment 4, the continuous groove 8 is provided along the edge of the bonding region 6a in the main surface 6 of the metal pattern 2, and the metal member 10 is located in the groove 8. When the semiconductor element 4 is solder-bonded to the bonding region 6a and the melted solder 5 is clotted, the solder 5 located near the edge of the bonding region 6a where the metal member 10 having the large heat conductivity is located can be clotted first. That is to say, a center part of the bonding region 6a is a part where the solder 5 is clotted last, thus an occurrence of a shrinkage cavity can be suppressed in a fillet part 5a where the solder 5 is clotted early. The occurrence of the shrinkage cavity in the solder 5 is suppressed, thus the heat radiation property can be improved in the semiconductor device 401.

Embodiment 5

Figure 9:
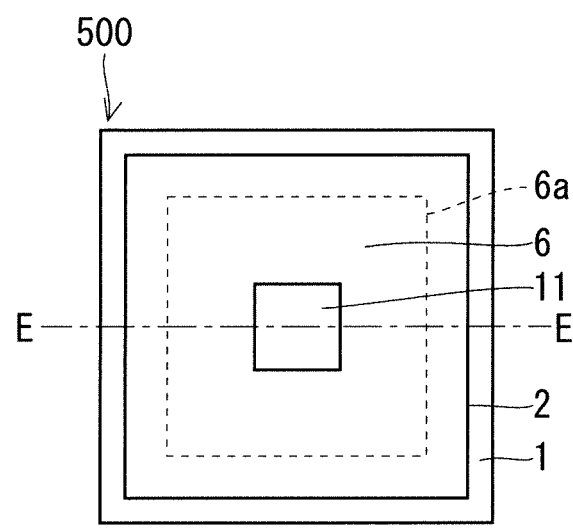
FIG. 9 A plan view of a semiconductor element bonding substrate according to an embodiment 5.
Figure 10:
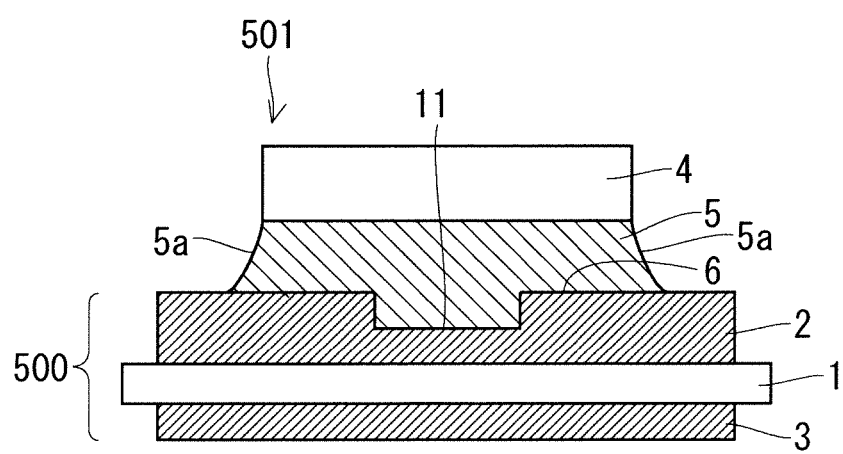
FIG. 10 A cross-sectional view of a semiconductor device according to the embodiment 5.

FIG. 9 is a plan view of a semiconductor element bonding substrate 500 according to a present embodiment 5. FIG. 10 is a cross-sectional view of a semiconductor device 501 according to the present embodiment 5. In the semiconductor device 501 illustrated in FIG. 10, a semiconductor element 4 is bonded to a bonding region 6*a* in the semiconductor element bonding substrate 500 by a solder 5. A cross section of the semiconductor device 501 illustrated in FIG. 10 corresponds to a cross section along a line segment E-E in FIG. 9.

The semiconductor element bonding substrate 500 includes an insulating plate 1 and a metal pattern 2. The metal pattern 2 is bonded to a main surface of the insulating plate 1. A main surface 6 of the metal pattern 2 on an opposite side of the insulating plate 1 includes the bonding region 6*a* to which the semiconductor element 4 is bonded by the solder 5.

In the bonding region 6*a* in the main surface 6 of the metal pattern 2, the main surface 6 of the metal pattern 2 has a height different between the center part of the bonding region 6*a* and a surrounding area of the center part. In the present embodiment 5, as illustrated in FIG. 10, a depressed part 11 is formed in the main surface 6 of the metal pattern 2 so that the center part of the bonding region 6*a* has a height lower than the surrounding area of the center part.

Plating may be performed on the main surface 6 of the metal pattern 2 to bond the metal pattern 2 and the semiconductor element 1 more successfully. As illustrated in FIG. 10, a back surface metal pattern 3 may be bonded to a surface of the insulating plate 1 on an opposite side of the metal pattern 2.

<Effect>

The semiconductor element bonding substrate 500 in the present embodiment 5 includes the insulating plate 1 and the metal pattern 2 bonded to the main surface of the insulating plate 1. The main surface 6 of the metal pattern 2 on the opposite side of the insulating plate 1 includes the bonding region 6*a* to which the semiconductor element 4 is bonded by the solder 5. The main surface 6 has the height different between the center part of the bonding region 6*a* and the surrounding area of the center part.

According to the semiconductor element bonding substrate 500 in the present embodiment 5, the height of the main surface 6 of the metal pattern 2 is made different between the center part of the bonding region 6*a* and the surrounding area of the center part, thus a timing of clotting the solder 5 can be made different between the center part of the bonding region 6*a* and the surrounding area of the center part. For example, the height of the center part of the bonding region 6*a* is lowered than the surrounding area of the center part, thus the solder 5 can be clotted early in the surrounding area of the center part of the bonding region 6*a*.

In the bonding region 6*a* in the semiconductor element bonding substrate 500 according to the present embodiment 5, the center part of the bonding region 6*a* has the height lower than the surrounding area of the center part. When the semiconductor element 4 is solder-bonded to the bonding region 6*a* and the melted solder 5 is clotted, the solder 5 is supplied to the depressed part 11 in a center of the bonding region 6*a*, and the solder 5 filling the depressed part 11 increases a heat capacity in a portion immediately below the center part of the semiconductor element 4. Accordingly, the solder 5 located near the edge of the bonding region 6*a* can be clotted first. That is to say, a center part of the bonding region 6*a* is a part where the solder 5 is clotted last, thus an occurrence of a shrinkage cavity can be suppressed in a fillet part 5*a* where the solder 5 is clotted early. The occurrence of the shrinkage cavity in the solder 5 is suppressed, thus the heat radiation property can be improved in the semiconductor device 501.

Embodiment 6

Figure 11:
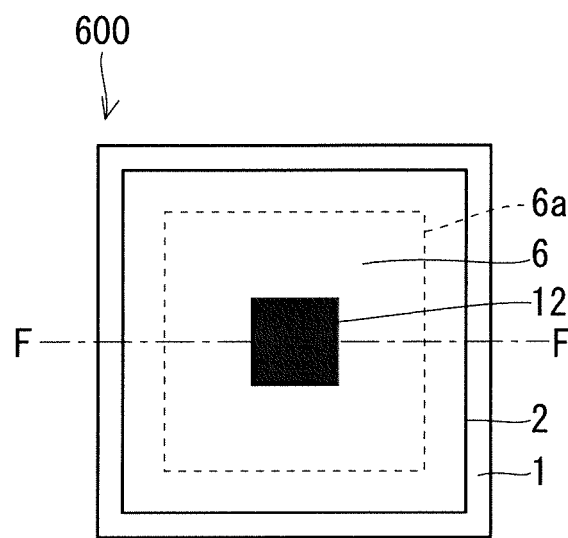
FIG. 11 A plan view of a semiconductor element bonding substrate according to an embodiment 6.
Figure 12:
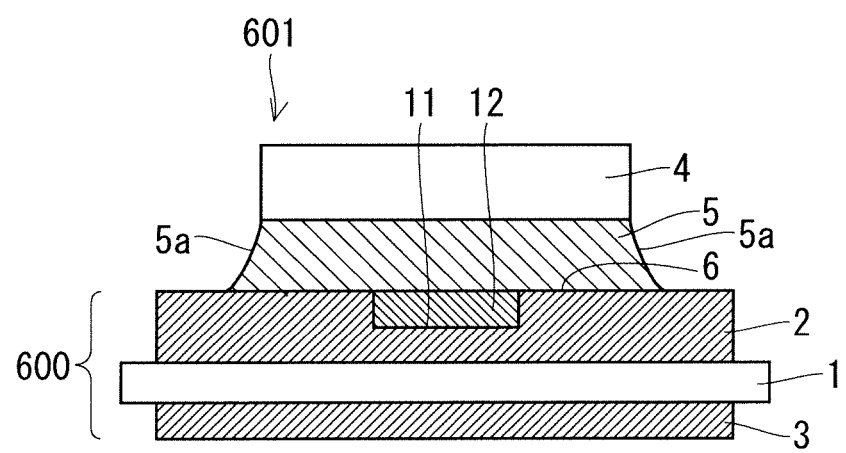
FIG. 12 A cross-sectional view of a semiconductor device according to the embodiment 6.

FIG. 11 is a plan view of a semiconductor element bonding substrate 600 according to a present embodiment 6. FIG. 12 is a cross-sectional view of a semiconductor device 601 according to the present embodiment 6. In the semiconductor device 601 illustrated in FIG. 12, a semiconductor element 4 is bonded to a bonding region 6*a* in the semiconductor element bonding substrate 600 by a solder 5. A cross section of the semiconductor device 601 illustrated in FIG. 12 corresponds to a cross section along a line segment F-F in FIG. 11.

The semiconductor element bonding substrate 600 further includes a metal member 12 located in a depressed part 11 in a center part of the bonding region 6*a* when compared with the semiconductor element bonding substrate 500 (FIG. 9) in the embodiment 5. The metal member 12 is formed of a material having a smaller heat conductivity than the solder 5. The metal member 12 is an alloy mainly containing Ni, for example. The semiconductor element bonding substrate 600 has the same configuration as the semiconductor element bonding substrate 500 (FIG. 9) other than the metal member 12, thus the description is omitted.

<Effect>

In the semiconductor element bonding substrate 600 according to the present embodiment 6, the metal member 12 is located in the depressed part 11 in the center part of the bonding region 6*a*, and the heat conductivity of the metal member 12 is smaller than that of the solder 5.

The metal member 12 having the small heat conductivity is embedded in the center part of the bonding region 6*a* to which the semiconductor element 4 is bonded, thus when the semiconductor element 4 is solder-bonded to the bonding region 6*a* and the melted solder 5 is clotted, the heat capacity in the portion immediately below the center part of the semiconductor element 4 increases. Accordingly, the solder 5 located near the edge of the bonding region 6*a* can be clotted first. That is to say, the center part of the bonding region 6*a* is a part where the solder 5 is clotted last, thus an occurrence of a shrinkage cavity can be suppressed in a fillet part 5*a* where the solder 5 is clotted early. The occurrence of the shrinkage cavity in the solder 5 is suppressed, thus the heat radiation property can be improved in the semiconductor device 601.

Embodiment 7

Figure 13:
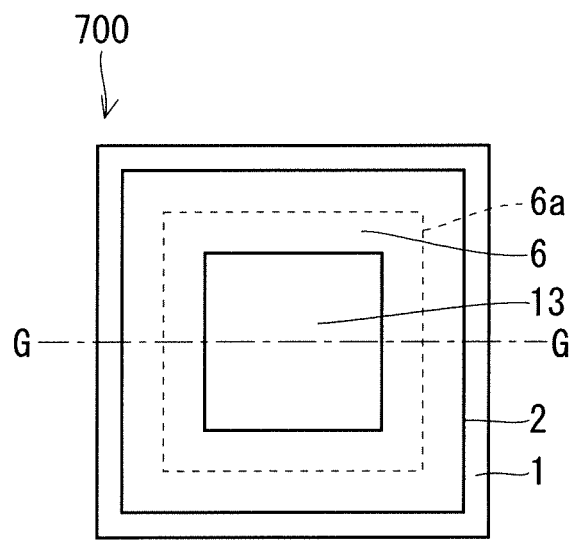
FIG. 13 A plan view of a semiconductor element bonding substrate according to an embodiment 7.
Figure 14:
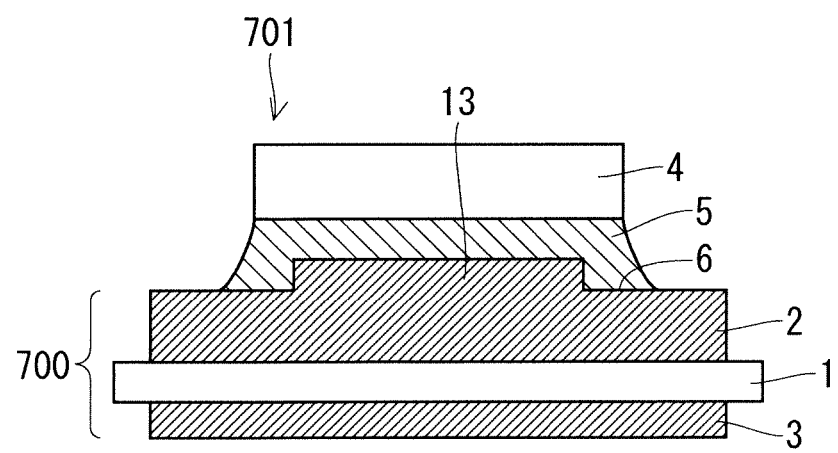
FIG. 14 A cross-sectional view of a semiconductor device according to the embodiment 7.

FIG. 13 is a plan view of a semiconductor element bonding substrate 700 according to a present embodiment 7. FIG. 14 is a cross-sectional view of a semiconductor device 701 according to the present embodiment 7. In the semiconductor device 701 illustrated in FIG. 14, a semiconductor element 4 is bonded to a bonding region 6*a* in the semiconductor element bonding substrate 700 by a solder 5. A cross section of the semiconductor device 701 illustrated in FIG. 14 corresponds to a cross section along a line segment G-G in FIG. 13.

The semiconductor element bonding substrate 700 includes an insulating plate 1 and a metal pattern 2. The metal pattern 2 is bonded to a main surface of the insulating plate 1. A main surface 6 of the metal pattern 2 on an opposite side of the insulating plate 1 includes the bonding region 6*a* to which the semiconductor element 4 is bonded by the solder 5.

In the bonding region 6*a* in the main surface 6 of the metal pattern 2, the main surface 6 of the metal pattern 2 has a height different between the center part of the bonding region 6a and a surrounding area of the center part. In the present embodiment 7, as illustrated in FIG. 14, a convex part 13 is formed in the main surface 6 of the metal pattern 2 so that the center part of the bonding region 6a has a height higher than the surrounding area of the center part.

Plating may be performed on the main surface 6 of the metal pattern 2 to bond the metal pattern 2 and the semiconductor element 1 more successfully. As illustrated in FIG. 14, a back surface metal pattern 3 may be bonded to a surface of the insulating plate 1 on an opposite side of the metal pattern 2.

<Effect>

In the bonding region 6a in the semiconductor element bonding substrate 700 according to the present embodiment 7, the center part of the bonding region 6a has the height higher than the surrounding area of the center part. A larger amount of solder 5 is supplied to the surrounding area of the center part of the bonding region 6a compared to the center part when the semiconductor element 4 is solder-bonded to the bonding region 6a. Thus, when the melted solder 5 is clotted, the solder 5 in the surrounding area of the center part of the bonding region 6a shrinks, thereby reducing a shrinkage of a fillet part 5a of the solder 5. Thus, it can be suppressed that a shrinkage cavity occurs in the fillet part 5a of the solder 5 and the shrinkage cavity enters a lower side of the semiconductor element 4. The occurrence of the shrinkage cavity in the solder 5 is suppressed, thus the heat radiation property can be improved in the semiconductor device 701.

Plating may be performed on the surface of the bonding region 6a in the metal pattern 2 in each of the semiconductor element bonding substrates 100, 200, 300, 400, 500, 600, and 700 described in the embodiments 1 to 7. A thin film of Ni, for example, is formed on the surface of the bonding region 6a in the metal pattern 2, the bonding by the solder 5 can be performed more successfully.

In the semiconductor devices 101, 201, 301, 401, 501, 601, and 701 described in the embodiments 1 to 7, the semiconductor element 4 includes a power semiconductor containing SiC or GaN. A particularly high heat radiation property is demanded in a switching element for power conversion, for example, in which a large current and high voltage are used and a switching is performed at high speed. It is particularly effective that the semiconductor device of the present invention has the configuration of including the power semiconductor containing SiC or GaN.

Embodiment 8

In a present embodiment 8, the semiconductor devices 101, 201, 301, 401, 501, 601, or 701 according to any one of the aforementioned embodiments 1 to 7 is applied to a power conversion device. A power conversion device 800 which is a three-phase inverter is described as an example of the power conversion device.

FIG. 15 is a diagram illustrating a configuration of a power conversion system according to the present embodiment 8. The power conversion system 800 illustrated in FIG. 15 is connected to a power source 901 and a load 902. The power source 901, which is a direct current power source, supplies a direct current power to the power conversion device 800. The power source 901 can be made up of various kinds of components such as a direct current system, a solar battery, and a rechargeable battery, for example. The power source 901 may be made up of a rectification circuit connected to an alternating current system or an AC/DC converter, for example. The power source 901 may also be made up of a DC/DC converter which converts a direct current power being output from the direct current system into a predetermined power.

The power conversion device 800 is a three-phase inverter connected between the power source 901 and the load 902. The power conversion device 800 converts the direct current power supplied from the power source 901 into the alternating current power, and supplies the alternating current power to the load 902. As illustrated in FIG. 15, the power conversion device 800 includes a power conversion circuit 801 and a control circuit 802. The control circuit 802 outputs a control signal for controlling a switching operation of the power conversion circuit 801 to the power conversion circuit 801. The power conversion circuit 801 converts the direct current power into the alternating current power based on the control signal, and outputs the alternating current power.

The power conversion circuit 801 is a three-phase full-bridge circuit having two levels, for example. For example, the two the semiconductor devices 101 connected in series correspond to a U-phase, a V-phase, and a W-phase, respectively. In this case, the power conversion circuit 801 includes six semiconductor devices 101 in total. The semiconductor device 101 may be any of the semiconductor devices 201, 301, 401, 501, 601, and 701.

The load 902 is a three-phase electrical motor driven by the alternating current power supplied from the power conversion device 800. The load 902 is not for specific purpose of use but is the electrical motor mounted on various types of electrical devices.

The load 902 is the electrical motor for a hybrid car, an electrical car, a rail vehicle, an elevator, or an air-conditioning equipment, for example.

In the above description, the power conversion circuit 801 is a three-phase full-bridge circuit, but is not limited thereto. Thus, the power conversion circuit 801 may be the circuit including at least one of the semiconductor devices 101, 201, 301, 401, 501, 601, and 701, and converts the electrical power.

<Effect>

The power conversion device 800 according to the present embodiment 8 includes the power conversion circuit 801 converting the input electrical power and outputting the electrical power and the control circuit 802 outputting the control signal to the power conversion circuit 801. The power conversion circuit 801 includes at least one of the semiconductor devices 101, 201, 301, 401, 501, 601, and 701.

As described in the embodiments 1 to 7, the occurrence of the shrinkage cavity in the solder 5 is suppressed, thus the heat radiation property can be improved in the semiconductor devices 101, 201, 301, 401, 501, 601, and 701. Accordingly, the heat radiation property of the power conversion device 800 including the semiconductor device can also be improved.

According to the present invention, the above embodiments can be arbitrarily combined, or each embodiment can be appropriately varied or omitted within the scope of the invention. The present invention has been shown and described in detail, the foregoing description is in all aspects illustrative and not restrictive. Various modifications not exemplified are construed to be made without departing from the scope of the present invention.

The invention claimed is:

1. A semiconductor element bonding substrate, comprising:
    an insulating plate; and a metal pattern bonded to a main surface of the insulating plate, the metal pattern having a first surface bonded to the insulating plate and a second surface, the second surface being opposite to the insulating plate, wherein the second surface of the metal pattern includes a bonding region to which a semiconductor element is bonded by a solder, the second surface of the metal pattern has a convex part at a center of the bonding region and a substantially flat part surrounding the convex part and extending from the convex part to an outermost edge of the metal pattern, the outermost edge of the metal pattern extending from the first surface of the metal pattern to the second surface of the metal pattern, the convex part protruding from the substantially flat part toward the semiconductor element, and the semiconductor element is directly bonded to both the convex part and a portion of the substantially flat part by the solder such that the semiconductor element vertically overlaps both the convex part and the portion of the substantially flat part.

2. The semiconductor element bonding substrate according to claim 1, wherein
plating is performed on a surface of the bonding region in the metal pattern.

3. A semiconductor device, comprising:
the semiconductor element bonding substrate according to claim 1; and
the semiconductor element bonded to the bonding region in the metal pattern by the solder.

4. The semiconductor device according to claim 3, wherein
the semiconductor element includes a power semiconductor including SiC or GaN.

5. A power conversion device, comprising:
a power conversion circuit converting electrical power which has been input and outputting the electrical power; and
a control circuit outputting a control signal to the power conversion circuit, wherein
the power conversion circuit includes at least one semiconductor device according to claim 3.

* * * * *